US009431421B2

(12) United States Patent
Vu et al.

(10) Patent No.: US 9,431,421 B2
(45) Date of Patent: *Aug. 30, 2016

(54) DATA LINE ARRANGEMENT AND PILLAR ARRANGEMENT IN APPARATUSES

(71) Applicant: Micron Technology, Inc., Boise, ID (US)

(72) Inventors: Luyen Vu, San Jose, CA (US); Mark A. Helm, Santa Cruz, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/850,781

(22) Filed: Sep. 10, 2015

(65) Prior Publication Data

US 2016/0005761 A1    Jan. 7, 2016

Related U.S. Application Data

(63) Continuation of application No. 14/175,901, filed on Feb. 7, 2014, now Pat. No. 9,159,736.

(51) Int. Cl.
*H01L 27/115* (2006.01)
*H01L 29/16* (2006.01)
*H01L 29/04* (2006.01)

(52) U.S. Cl.
CPC ...... *H01L 27/11582* (2013.01); *H01L 27/1157* (2013.01); *H01L 27/11519* (2013.01); *H01L 27/11524* (2013.01); *H01L 27/11526* (2013.01); *H01L 27/11556* (2013.01); *H01L 27/11565* (2013.01); *H01L 27/11573* (2013.01); *H01L 29/04* (2013.01); *H01L 29/16* (2013.01)

(58) Field of Classification Search
CPC ................. H01L 27/11582; H01L 27/11526; H01L 27/11556; H01L 27/11573; H01L 27/11524; H01L 27/1157; H01L 27/11519; H01L 27/11565

See application file for complete search history.

(56) References Cited

U.S. PATENT DOCUMENTS

2006/0138397 A1    6/2006  Mattis
2010/0159657 A1    6/2010  Arai et al.
2011/0303958 A1   12/2011  Matsuo et al.
2012/0032250 A1    2/2012  Son et al.

(Continued)

FOREIGN PATENT DOCUMENTS

WO   PCT/US2015/011926    3/2015

OTHER PUBLICATIONS

U.S. Appl. No. 13/564,458, filed Aug. 1, 2012, Feeley et al.

*Primary Examiner* — Mamadou Diallo
(74) *Attorney, Agent, or Firm* — Wells St. John P.S.

(57) ABSTRACT

Some embodiments include an apparatus having semiconductor pillars in a substantially hexagonally closest packed arrangement. The hexagonally closest packed arrangement includes a repeating pillar pattern which has at least portions of 7 different pillars. Each of the different pillars in a respective one of the repeating pillar patterns is capable of being electrically coupled to a different data line of a plurality of data lines. Some embodiments include an apparatus having semiconductor pillars in a substantially hexagonally closest packed arrangement. The hexagonally closest packed arrangement includes a repeating pillar pattern having at least portions of 7 different pillars. All 7 different pillars of a repeating pillar pattern are encompassed by a single drain-side select gate (SGD).

18 Claims, 14 Drawing Sheets

(56) References Cited

U.S. PATENT DOCUMENTS

| | | |
|---|---|---|
| 2013/0248974 A1 | 9/2013 | Alsmeier et al. |
| 2013/0256775 A1 | 10/2013 | Shim et al. |
| 2015/0206898 A1* | 7/2015 | Chen .................. H01L 27/11582 257/324 |
| 2015/0206899 A1* | 7/2015 | Chen .................. H01L 27/11582 257/324 |

* cited by examiner

US 9,431,421 B2

1

DATA LINE ARRANGEMENT AND PILLAR ARRANGEMENT IN APPARATUSES

RELATED PATENT DATA

This patent resulted from a continuation of U.S. patent application Ser. No. 14/175,901, which was filed Feb. 7, 2014, which issued as U.S. Pat. No. 9,159,736 and which is hereby incorporated herein by reference.

TECHNICAL FIELD

Data lines, select gates and pillar arrangements in apparatuses such as vertical NAND.

BACKGROUND

Memory provides data storage for electronic systems. Flash memory is one type of memory, and has numerous uses in modern computers and devices. For instance, modern personal computers may have BIOS stored on a flash memory chip. As another example, it is becoming increasingly common for computers and other devices to utilize flash memory in solid state drives to replace conventional hard drives. As yet another example, flash memory is popular in wireless electronic devices because it enables manufacturers to support new communication protocols as they become standardized, and to provide the ability to remotely upgrade the devices for enhanced features.

NAND may be a basic architecture of flash memory. Example NAND architecture is described in U.S. Pat. No. 7,898,850. NAND architecture may be configured to comprise vertically-stacked memory cells.

FIG. 1 shows a block diagram of a prior art device 100 which includes a memory array 102 having a plurality of memory cells 103 arranged in rows and columns along with access lines 104 (e.g., word lines to conduct signals WL0 through WLm) and first data lines 106 (e.g., bitlines to conduct signals BL0 through BLn). Access lines 104 and first data lines 106 may be used to transfer information to and from the memory cells 103. A row decoder 107 and a column decoder 108 decode address signals A0 through AX on address lines 109 to determine which ones of the memory cells 103 are to be accessed. A sense amplifier circuit 115 operates to determine the values of information read from the memory cells 103. An I/O circuit 117 transfers values of information between the memory array 102 and input/output (I/O) lines 105. Signals DQ0 through DQN on the I/O lines 105 can represent values of information read from or to be written into the memory cells 103. Other devices can communicate with the device 100 through the I/O lines 105, the address lines 109, or the control lines 120. A memory control unit 118 controls memory operations to be performed on the memory cells 103 utilizing signals on the control lines 120. The device 100 can receive supply voltage signals Vcc and Vss on a first supply line 130 and a second supply line 132, respectively. The device 100 includes a select circuit 140 and an input/output (I/O) circuit 117. The select circuit 140 can respond, via the I/O circuit 117, to signals CSEL1 through CSELn to select signals on the first data lines 106 and the second data lines 113 that can represent the values of information to be read from or to be programmed into the memory cells 103. The column decoder 108 can selectively activate the CSEL1 through CSELn signals based on the A0 through AX address signals on the address lines 109. The select circuit 140 can select the signals on the first data lines 106 and the second data lines 113 to provide communication between the memory array 102 and the I/O circuit 117 during read and programming operations.

FIG. 2 shows a block diagram of a prior art memory array (e.g., the memory array 102) in the form of a 3D NAND memory device 200. The device 200 may comprise a plurality of strings of charge storage devices. In a first (e.g., Z-Z') direction, each string of charge storage devices may comprise, for example, thirty two charge storage devices stacked over one another with each charge storage device corresponding to one of, for example, thirty two tiers (e.g., Tier0-Tier31). The charge storage devices of a respective string may share a common channel region, such as one formed in a respective pillar of semiconductor material (e.g., polysilicon) about which the string of charge storage devices are formed. In a second (e.g., X-X') direction, each first group of, for example, sixteen first groups of the plurality of strings may comprise, for example, eight strings sharing a plurality (e.g., thirty two) of access lines (WLs). Each of the plurality of access lines (hereinafter used interchangeably with "global control gate (CG) lines") may couple (e.g., electrically or otherwise operably connect) the charge storage devices corresponding to a respective tier of the plurality of tiers of each string of a corresponding one of the first groups. The charge storage devices coupled by the same access line (and thus corresponding to the same tier) may be logically grouped into, for example, two pages, such as P0/P32, P1/P33, P2/P34 and so on, when each charge storage device comprises a multi-level cell capable of storing two bits of information. In a third (e.g., Y-Y') direction, each second group of, for example, eight second groups of the plurality of strings may comprise sixteen strings coupled by a corresponding one of eight data lines (BLs). The CGs of the (e.g., sixteen) charge storage devices corresponding to a respective tier of the (e.g., sixteen) strings of each second group of strings may be physically coupled by a respective plate. Similarly, SGSs of the (e.g., sixteen) strings of each second group of strings may be physically coupled by a single plate. The size of a memory block may comprise 1,024 pages and total about 16 MB (e.g., 16 WLs×32 Tiers×2 bits=1,024 pages/block, block size=1,024 pages×16 KB/page=16 MB). The number of the strings, tiers, access lines, data lines, first groups, second groups and/or pages may be greater or smaller than those shown in FIG. 2.

FIG. 3 shows a cross sectional view of a memory block 300 of the 3D NAND memory device 200 of FIG. 2 in an X-X' direction, including fifteen strings of charge storage devices in one of the sixteen first groups of strings described with respect to FIG. 2. The plurality of strings of the memory block 300 may be grouped into a plurality of subsets 310, 320, 330 (e.g., tile columns), such as tile column$_I$, tile column$_j$ and tile column$_K$, with each subset (e.g., tile column) comprising a "partial block" of the memory block 300. A global SGD line 340 may be coupled to the SGDs of the plurality of strings. For example, the global SGD line 340 may be coupled to a plurality (e.g., three) of sub-SGD lines 342, 344, 346 with each sub-SGD line corresponding to a respective subset (e.g., tile column), via a corresponding one of a plurality (e.g., three) of sub-SGD drivers 332, 334, 336. Each of the sub-SGD drivers 332-336 may concurrently couple or cut off the SGDs of the strings of a corresponding partial block (e.g., tile column) independently of those of other partial blocks. A global SGS line 360 may be coupled to the SGSs of the plurality of strings. For example, the global SGS line 360 may be coupled to a plurality of sub-SGS lines 362, 364, 366 with each sub-SGS line corresponding to the respective subset (e.g., tile column), via a corresponding one of a plurality of sub-SGS drivers 322, 324, 326. Each of the sub-SGS drivers 322-326 may concurrently couple or cut off the SGSs of the strings of a corresponding partial block (e.g., tile column) independently of those of other partial blocks. A global access line (e.g., a global CG line) 350 may couple the charge storage devices corresponding to the respective tier of each of the plurality of strings. Each global CG line (e.g., the global CG line 350) may be coupled to a plurality of sub-access lines (e.g., sub-CG lines) 352, 354, 356 via a corresponding one of a plurality of sub-string drivers 312, 314 and 316. Each of the sub-string drivers may concurrently couple or cut off the charge storage devices corresponding to the respective partial block and/or tier independently of those of other partial blocks and/or other tiers. The charge storage devices corresponding to the respective subset (e.g., partial block) and the respective tier may comprise a "partial tier" (e.g., a single "tile") of charge storage devices. The strings corresponding to the respective subset (e.g., partial block) may be coupled to a corresponding one of sub-sources 372, 374 and 376 (e.g., "tile source") with each sub-source being coupled to a respective power source.

FIG. 4 shows a prior art apparatus 10 having a plurality of vertically-stacked memory cells 15. Breaks are provided within vertical stacks 12-14 of memory cells 15 to indicate that there may be additional memory cells besides those shown. Any suitable number of memory cells may be present. For instance, the individual stacks 12-14 may comprise 8 memory cells, 16 memory cells, 32 memory cells, 64 memory cells, . . . , 256 memory cells, 512 memory cells, etc. The stacks 12-14 can be provided over an electrically conductive material 16, which in turn can be supported by a semiconductor base 18. A break is provided between the material 16 and the base 18 to indicate that there may be additional materials and/or integrated circuit structures between the base and the material 16. Similarly, a break is provided between the material 16 and each of the stacks 12-14 to indicate that there may be additional materials and/or integrated circuit structures between the stacks and the material 16. The material 16 may comprise a common source and/or source-side select gate (SGS); with the term source-side indicating that material 16 is on the source side of the stacks 12-14. Material 16 may comprise p-type doped silicon and/or other suitable conductively-doped semiconductor material. Bitlines (not shown) may be provided above material 16, with such bitlines being "drain" connections to stacks. Semiconductor base 18 may comprise semiconductor material, and in some embodiments may comprise, consist essentially of, or consist of monocrystalline silicon. SGD devices 20-22 (e.g., transistors having the SGDs as control gates) are provided over stacks 12-14, respectively. The SGDs may comprise one or more of various metals (for instance, tungsten, titanium, etc.), metal-containing compositions (for instance, metal silicide, metal nitride, etc.), and conductively-doped semiconductor materials (for instance, conductively-doped silicon). The SGD devices are drain-side devices in that they are on the drain side of the stacks 12-14.

BRIEF DESCRIPTION OF THE DRAWINGS

FIG. 15 graphically illustrates a relationship between bitline pitch and SGD pitch for apparatuses of the type illustrated in FIG. 2.

DETAILED DESCRIPTION OF THE ILLUSTRATED EMBODIMENTS

Some embodiments pertain to vertical stacks of memory cells associated with (e.g., surrounding) substantially vertical semiconductor (e.g., polysilicon) pillars extending upwardly from a semiconductor substrate. The pillars may be in a substantially hexagonally closest packed (HCP) arrangement, with the term "substantially" indicating that the arrangement is hexagonally closest packed to within reasonable tolerances of fabrication and measurement. The pillars may extend through, and be associated with, vertically-stacked memory cells.

Data lines (referred to herein by example as bitlines) and drain-side select gates (SGDs) may be provided proximate the pillars. The SGDs may be separated from the pillars by gate dielectric material (such as, for example, silicon dioxide). The bitlines may be provided proximate to (e.g., over) respective ends of a plurality of the pillars, and define columns; and the SGDs may be provided proximate to (e.g., at least partially surround) respective ends of a plurality of pillars and define tiles. In operation, activation of a particular SGD causes one or more respective pillars to be electrically coupled to one or more respective bitlines.

In some embodiments, a relationship between bitline pitch and SGD pitch is utilized to develop apparatuses suitable for particular applications. In some embodiments, specific apparatuses are developed having SGD pitch large enough that an entire pillar pattern within an HCP arrangement of pillars is encompassed by a single SGD.

Figure 1:
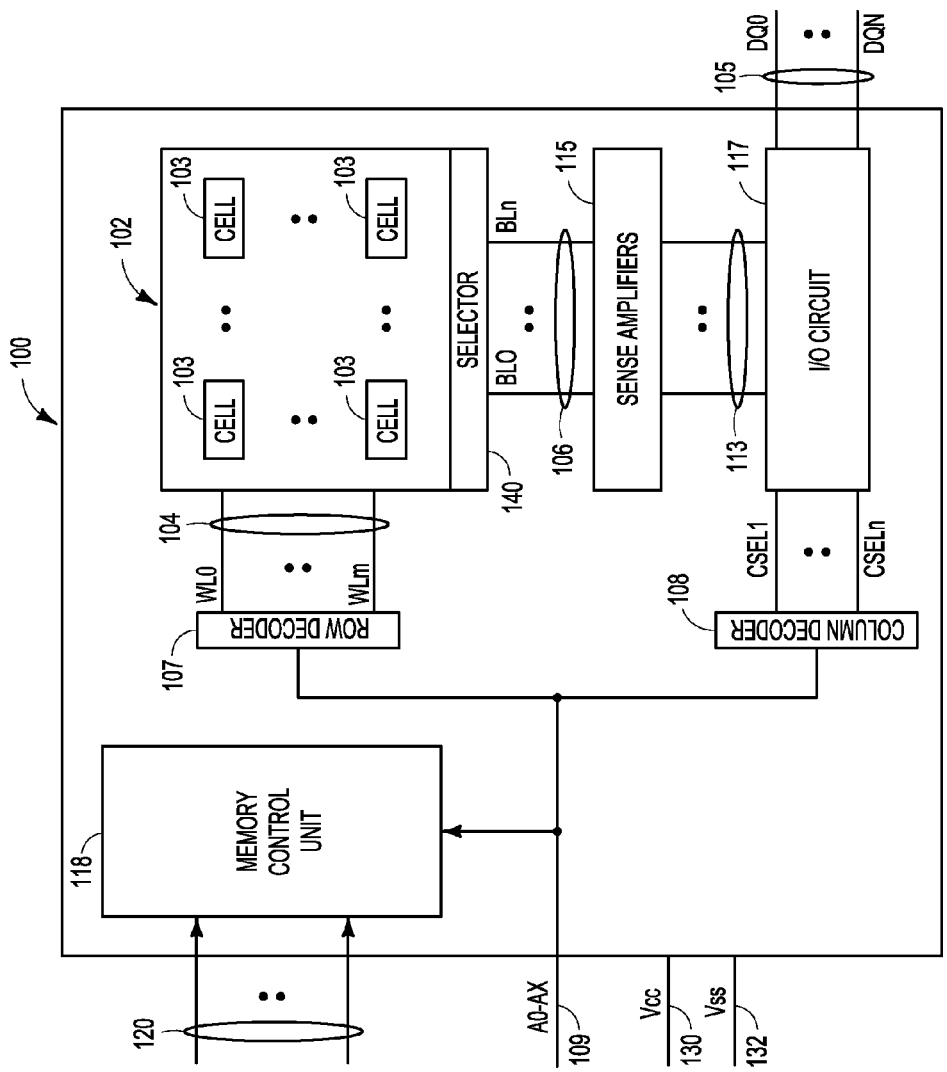
FIG. 1 shows a block diagram of a prior art memory device having a memory array with memory cells.
Figure 2:
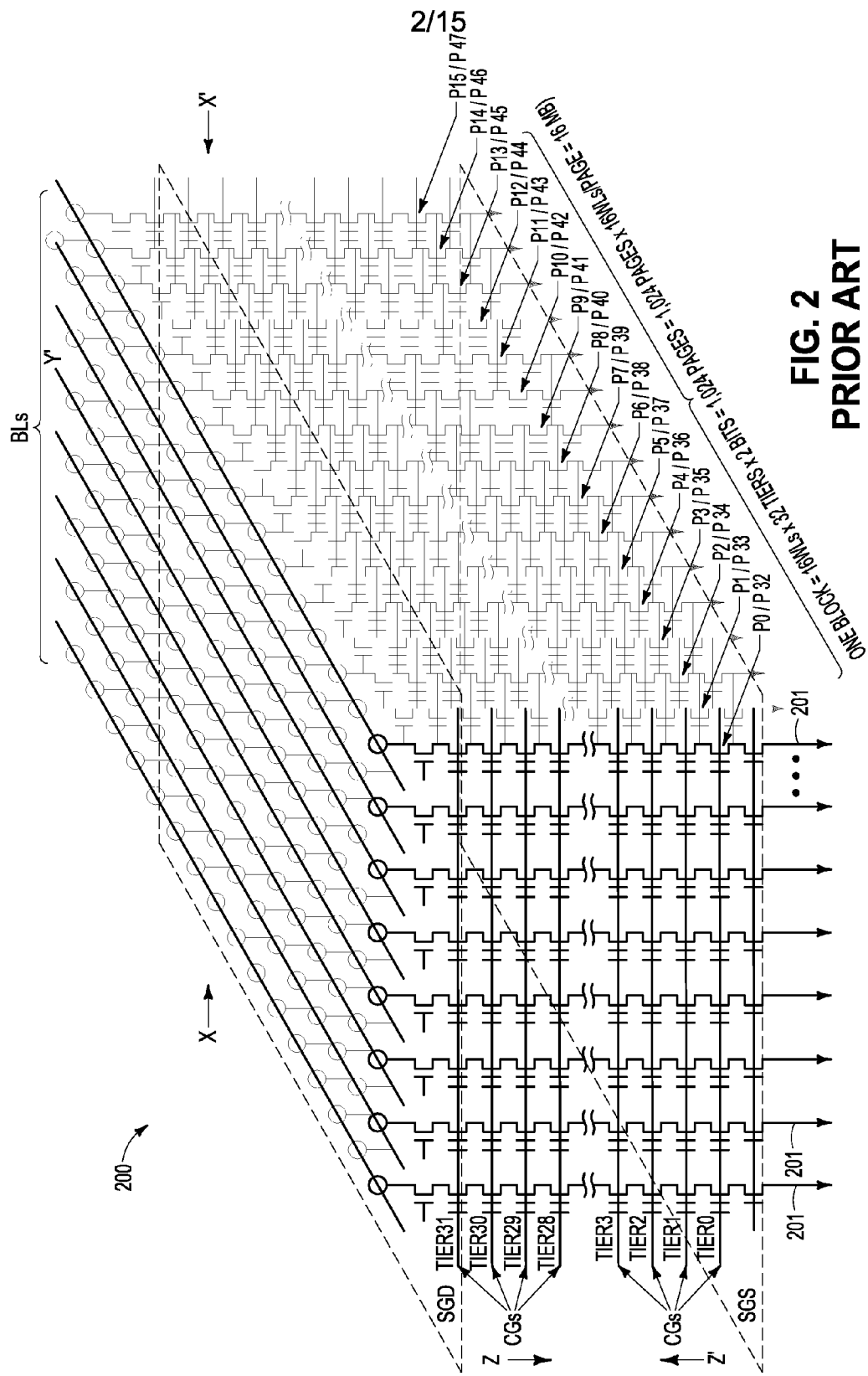
FIG. 2 shows a schematic diagram of the prior art memory array of FIG. 1 in the form of a 3D NAND memory device.
Figure 3:
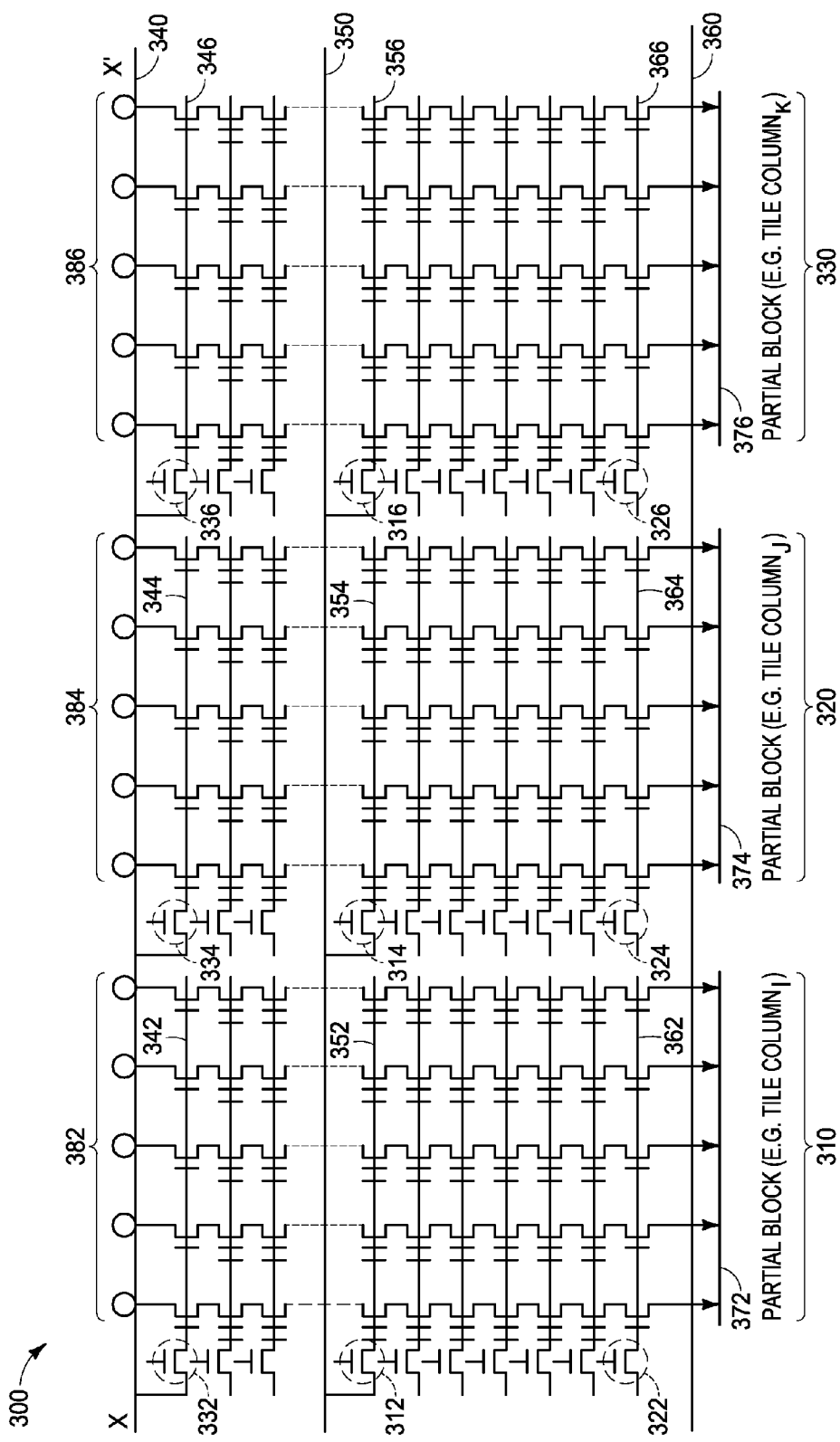
FIG. 3 shows a cross sectional view of the prior art 3D NAND memory device of FIG. 2 in an X-X' direction.
Figure 4:
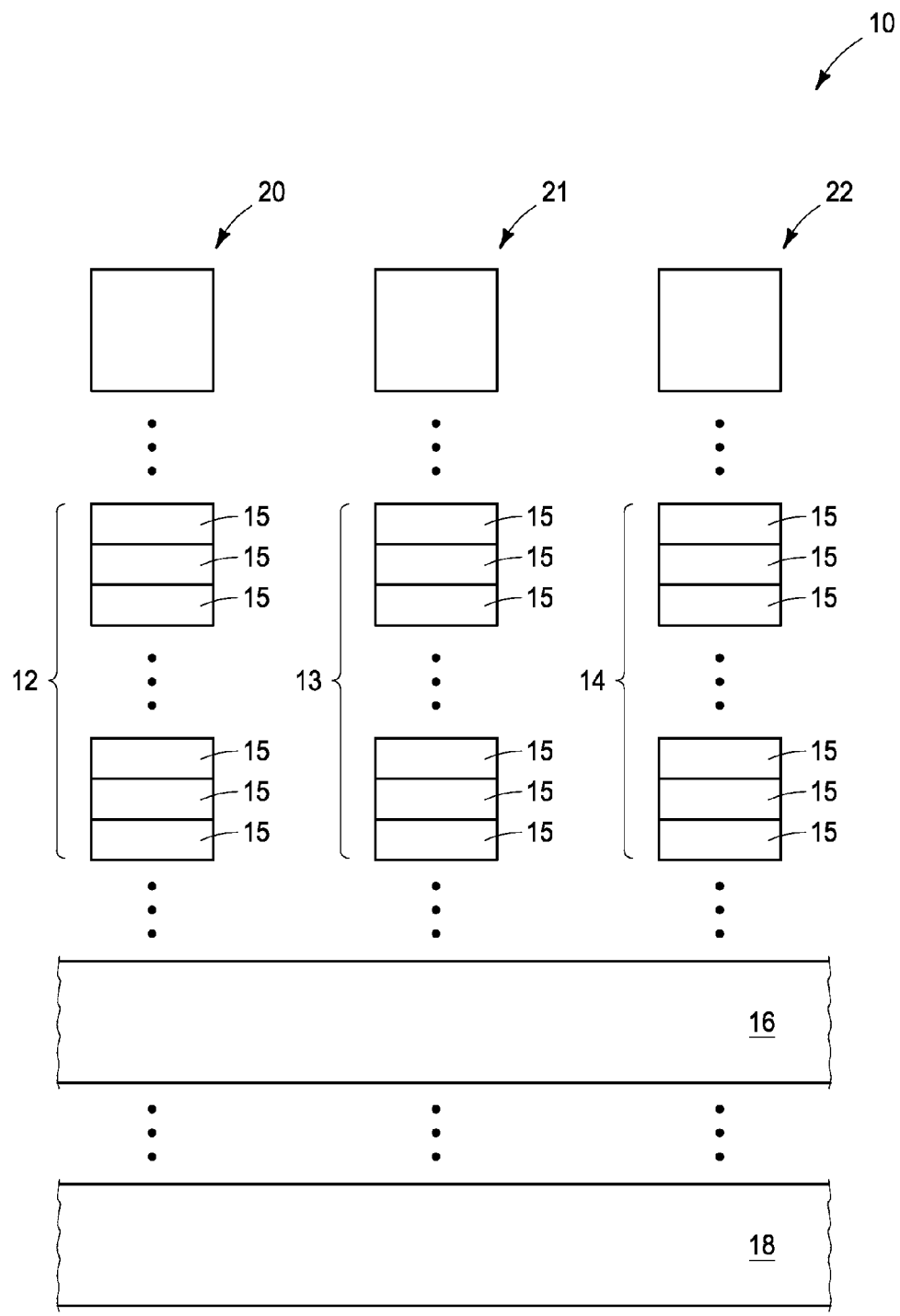
FIG. 4 is a diagrammatic cross-sectional view of a portion of a prior art apparatus including vertical stacks of memory cells.
Figure 5:
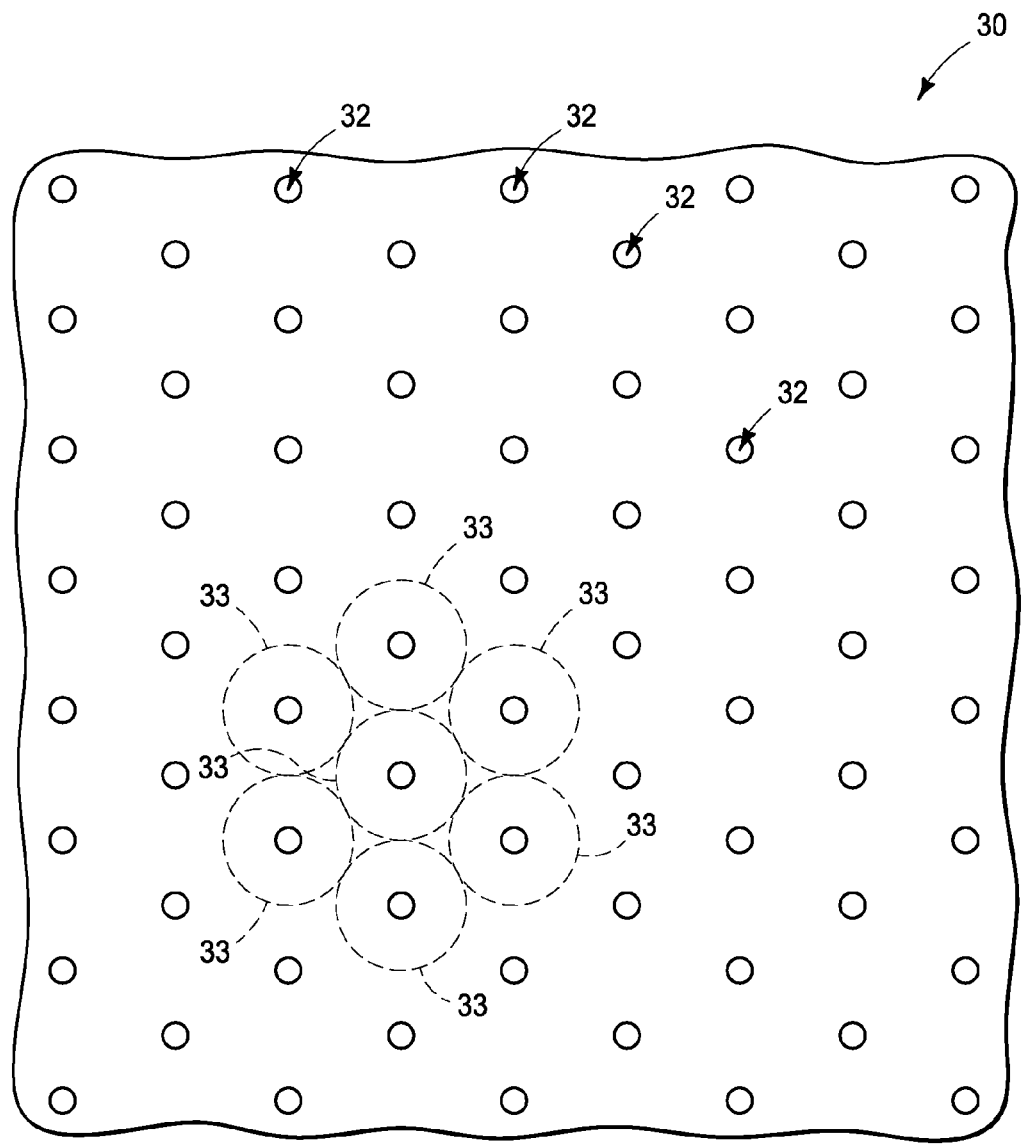
FIG. 5 is a diagrammatic top view of a portion of an apparatus including semiconductor pillars in a hexagonally closest packed arrangement.

Example embodiments are described below with reference to FIGS. 5-15. FIG. 5 shows a top view of an apparatus 30 having a plurality of pillars 32 (only some of which are labeled) in an HCP arrangement. The pillars 32 are associated with vertically stacked memory cells; and may be, for example, associated with stacks 12-14 of the type described with reference to prior art FIG. 4. The pillars may comprise semiconductor material (such as polysilicon). In some embodiments, the pillars may comprise semiconductor material at least partially surrounding dielectric material (for instance, silicon dioxide). Central pillars of vertically-stacked memory cells are illustrated to simplify the drawing, as opposed to showing entire lateral dimensions of the vertically-stacked memory cells in a closest packed arrangement. However, lateral boundaries of seven of the stacks are diagrammatically illustrated in FIG. 5 with dashed-lines 33 to show that the stacks are in a closest packed arrangement.

Figure 6:
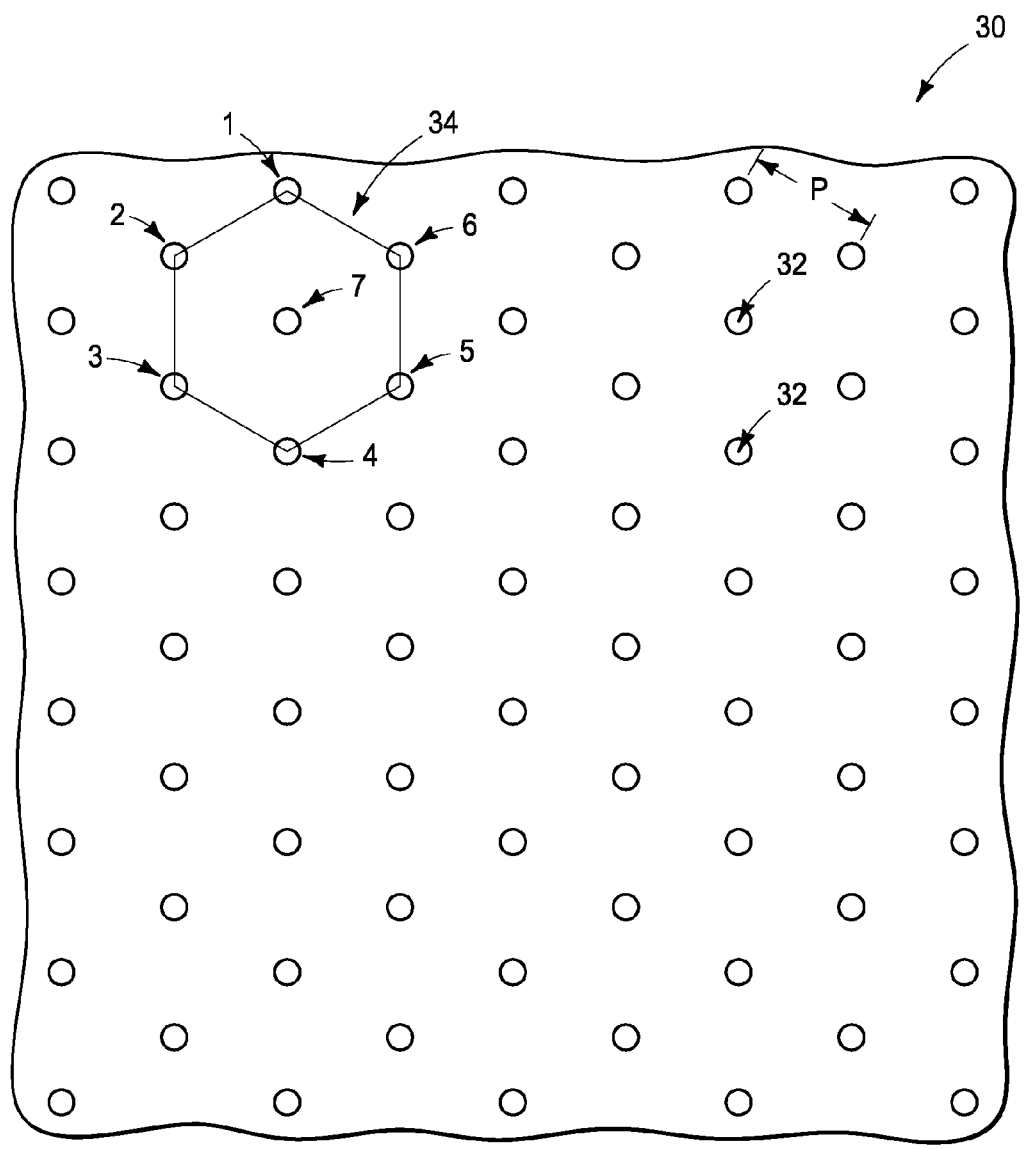
FIG. 6 is another diagrammatic top view of the example embodiment of FIG. 5.

The HCP arrangement of FIG. 5 comprises a repeating pillar pattern, with one of such patterns being specifically labeled as a pattern 34 in FIG. 6. The pattern 34 comprises seven sequentially-numbered pillars (numbered 1-7). The sequentially-numbered pillars are identical to all of the other pillars 32 (only some of which are labeled), but are numbered with sequential integers to assist in illustrating pillar pattern 34. The pillar pattern 34 is hexagonally-shaped. The pillar pattern comprises portions of the pillars 1-6, and comprises an entirety of pillar 7; and accordingly comprises at least portions of seven different pillars.

The pillars of FIG. 6 are shown to be on a pitch "P". Numerous choices are available for arranging bitlines relative to pillars of apparatus 30, with some of the arrangements having pitch "P", and other arrangements having a pitch less than "P". Some example bitline arrangements are shown in FIGS. 7-10.

Figure 7:
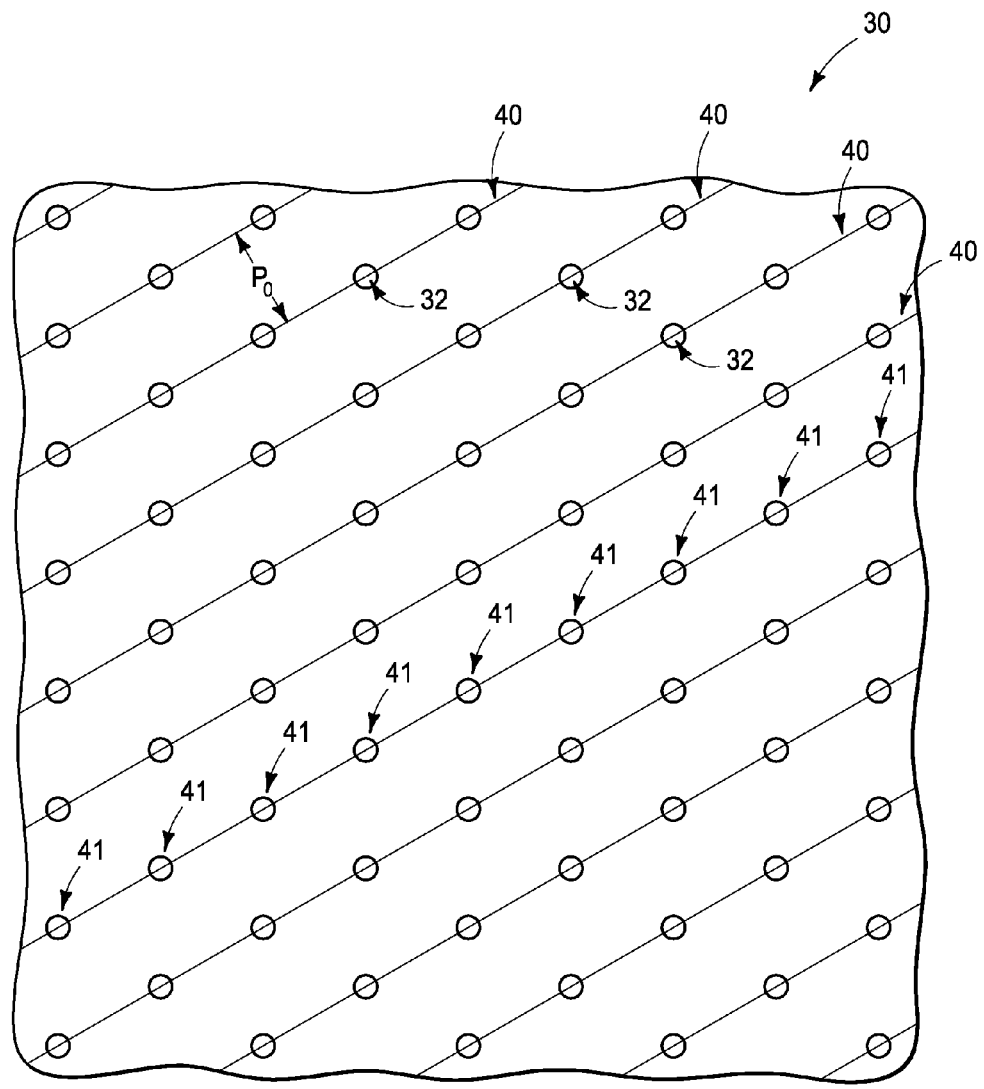
FIGS. 7-10 are diagrammatic top views of the example embodiment arrangements of FIG. 5 illustrating example embodiment bitline arrangements.
Figure 8:
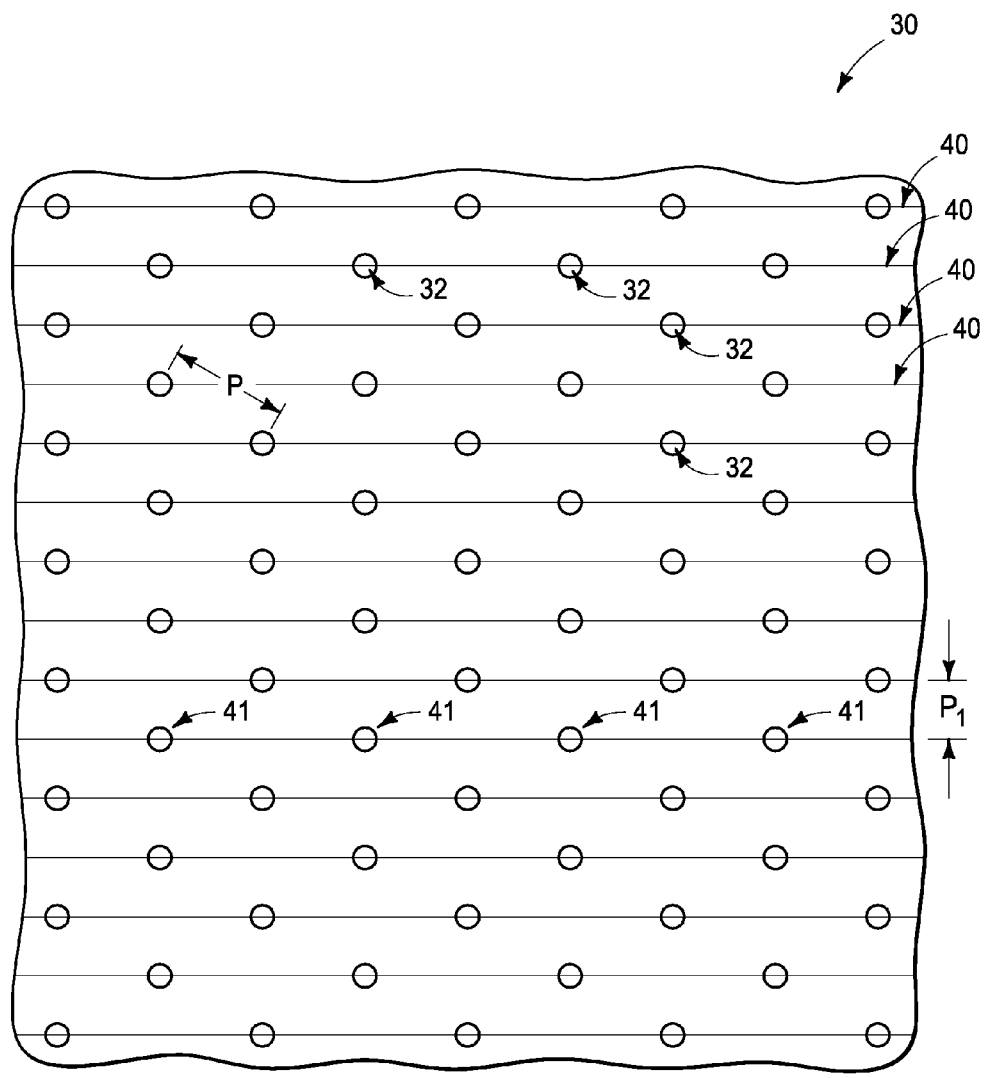
Figure 9:
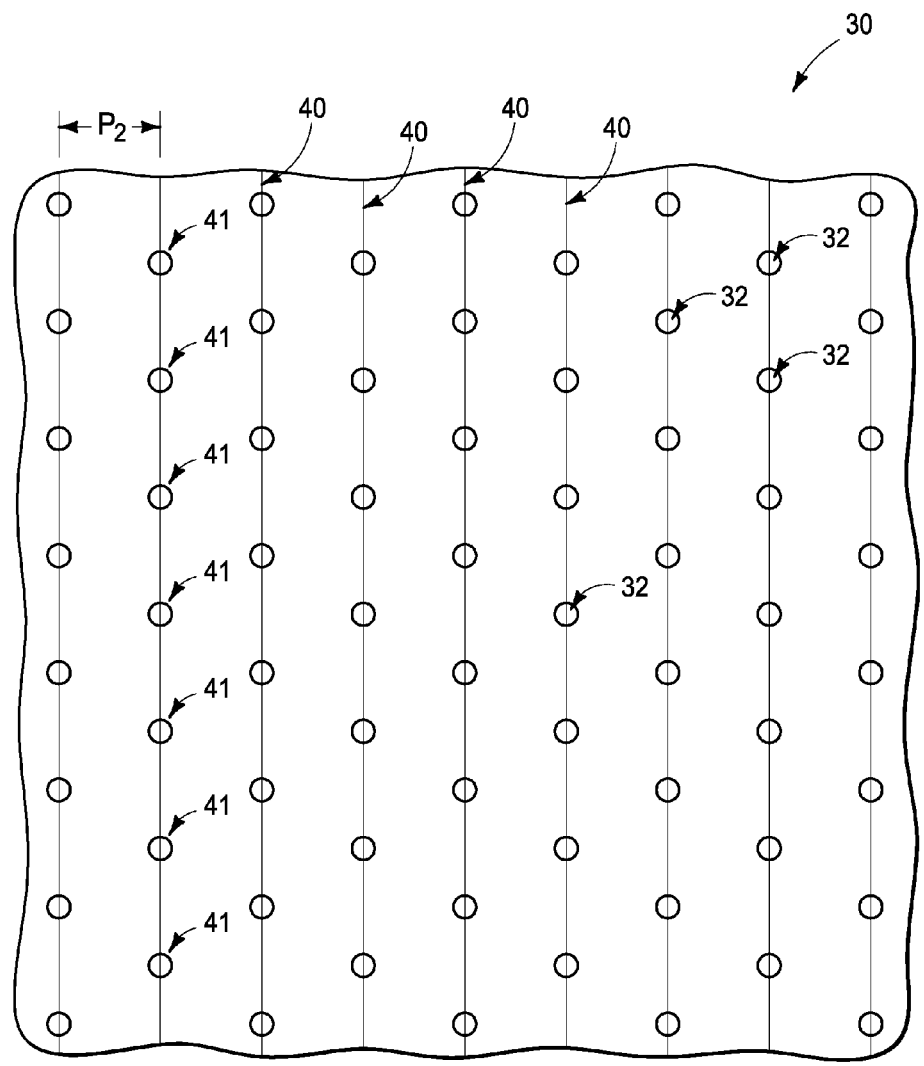
Figure 10:
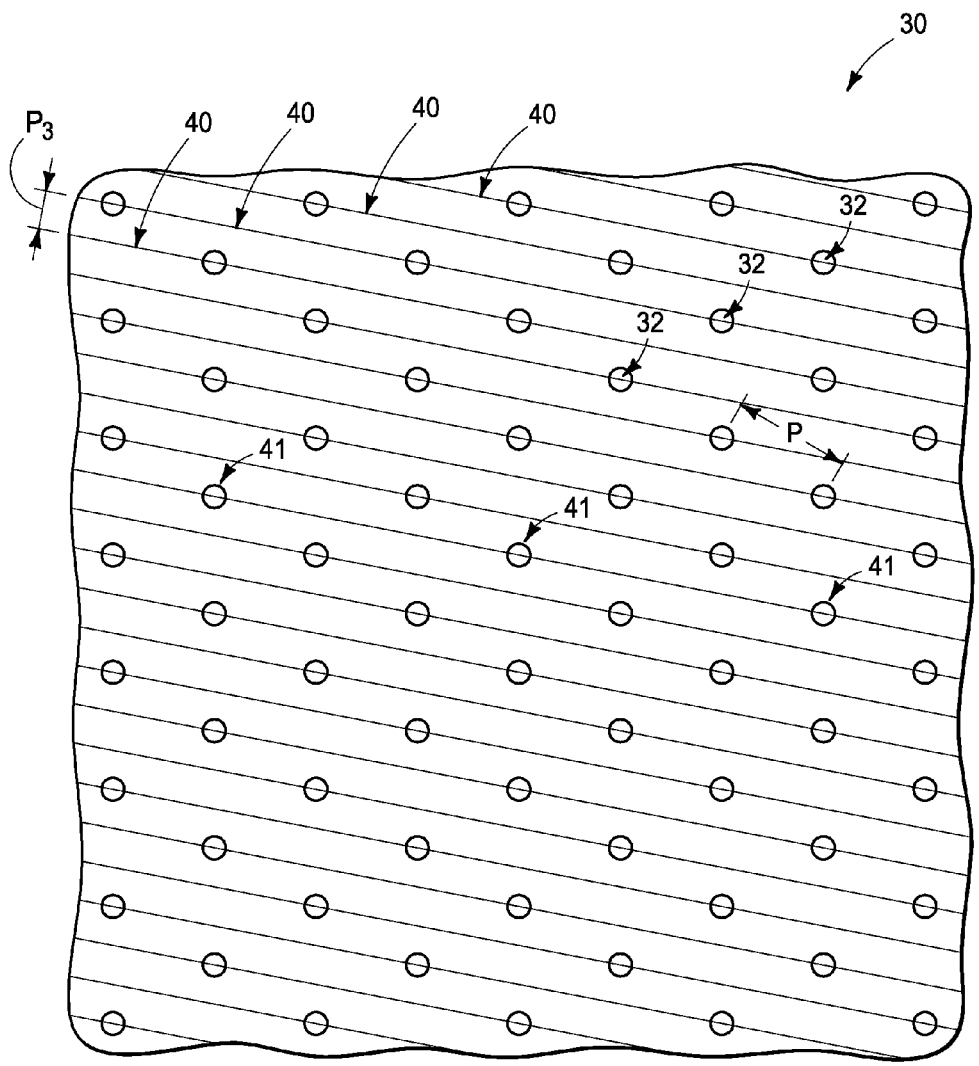

FIG. 7 shows bitlines 40 (only some which are labeled) extended across pillars 32 (only some which are labeled) in an arrangement with a pitch of the bitlines of "$P_0$", being different than the pitch "P" of the pillars (specifically, $P_0$ may be related to P through the Pythagorean theorem, with one being a side of a right triangle and with the other being a hypotenuse). FIGS. 8-10 show bitlines 40 (only some of which are labeled) extended across pillars 32 (only some which are labeled) in further arrangements such that pitches of the bitlines (shown as $P_1$ in FIG. 8, $P_2$ in FIG. 9, and $P_3$ in FIG. 10) are different than the pitch "P" of the pillars. Notably, some of the bitline pitches may be substantially smaller than the pitch "P" between the pillars. For instance, the pitch $P_3$ of FIG. 10 is less than about ⅓ of the pitch "P". Accordingly, in some embodiments a pitch of the bitlines may be less than or equal to about ⅓ of a distance between immediately adjacent pillars 32 in a configuration in which the pillars are substantially in an HCP arrangement of the type illustrated in FIGS. 5-10.

The bitlines 40 may be each considered to be proximate a plurality of the pillars, with the pillars capable of being coupled to the same bitline as one another being in a same column as one another. For instance, some pillars are labeled as pillars 41 in each of FIGS. 7-10 to illustrate a plurality of pillars in the same column as one another. The pillars 41 are identical to the other pillars 32, and are labeled differently only to illustrate individual columns.

Figure 12:
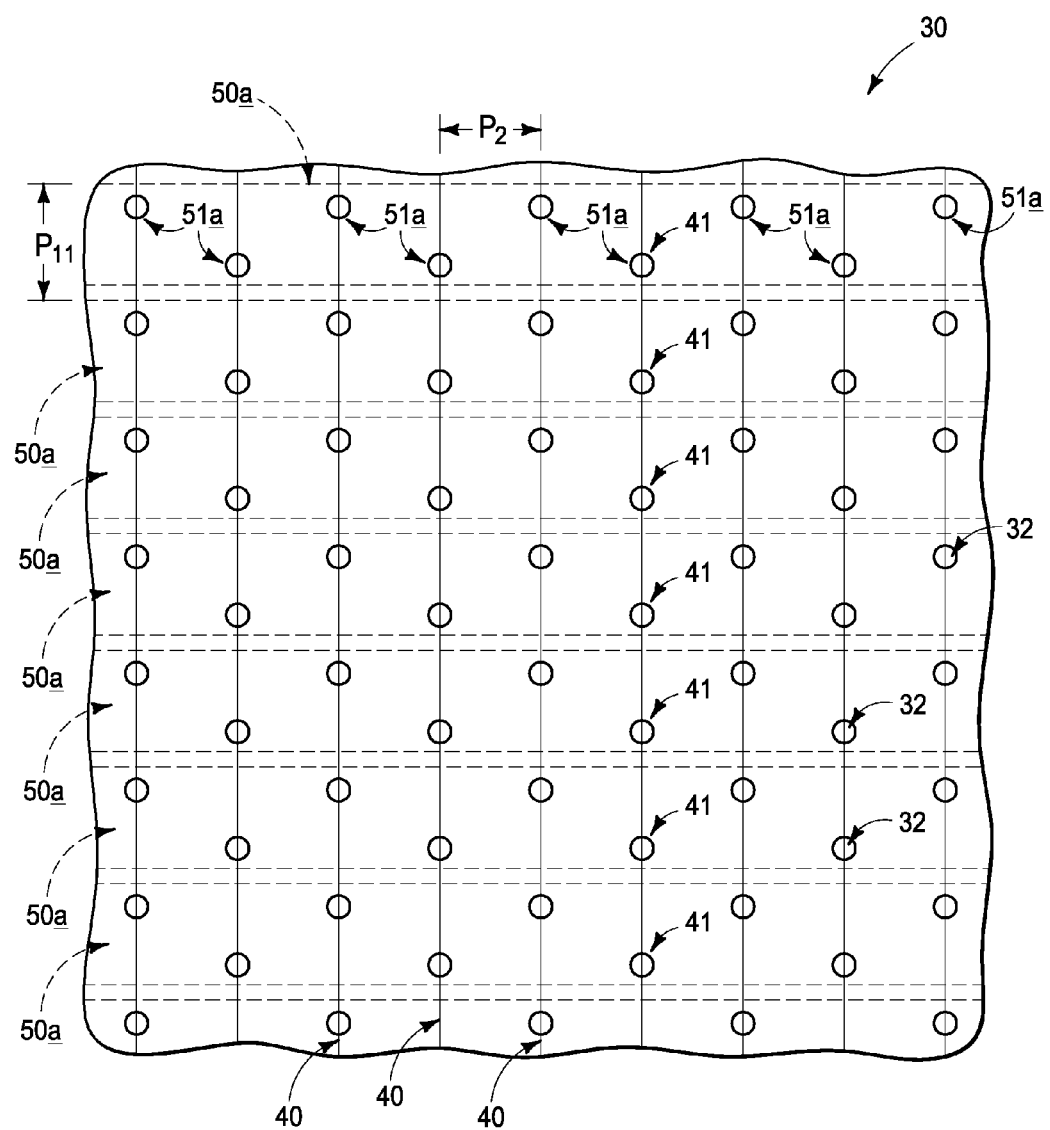
Figure 13:
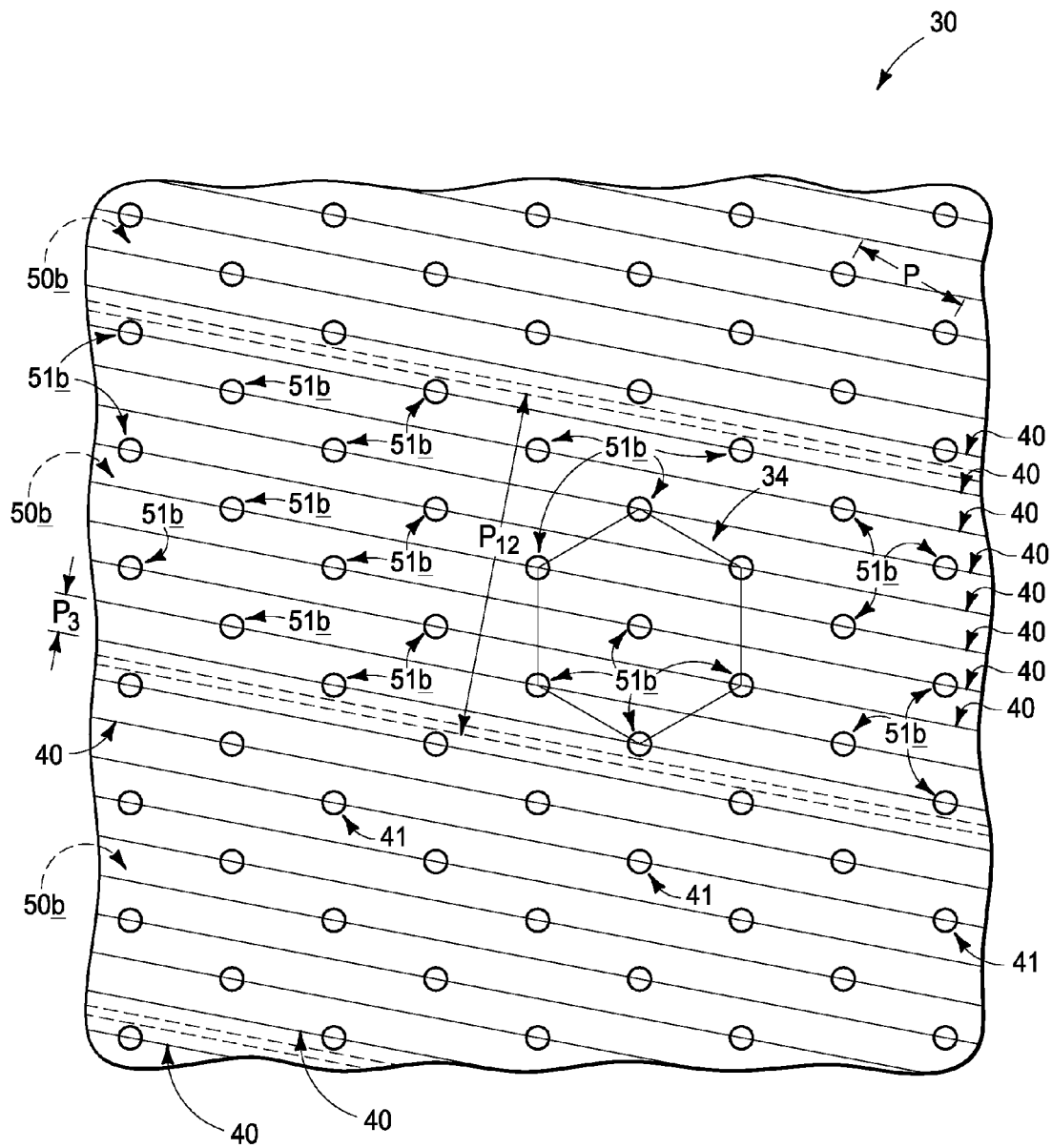

Numerous choices are available relative to an arrangement of SGDs across the pillars of apparatus 30. Such arrangements may follow two general rules: the SGDs are substantially orthogonal to the bitlines; and the SGD width is defined such that it contains one pillar from every bitline. Some example SGD arrangements are shown in FIGS. 11-13.

Figure 11:
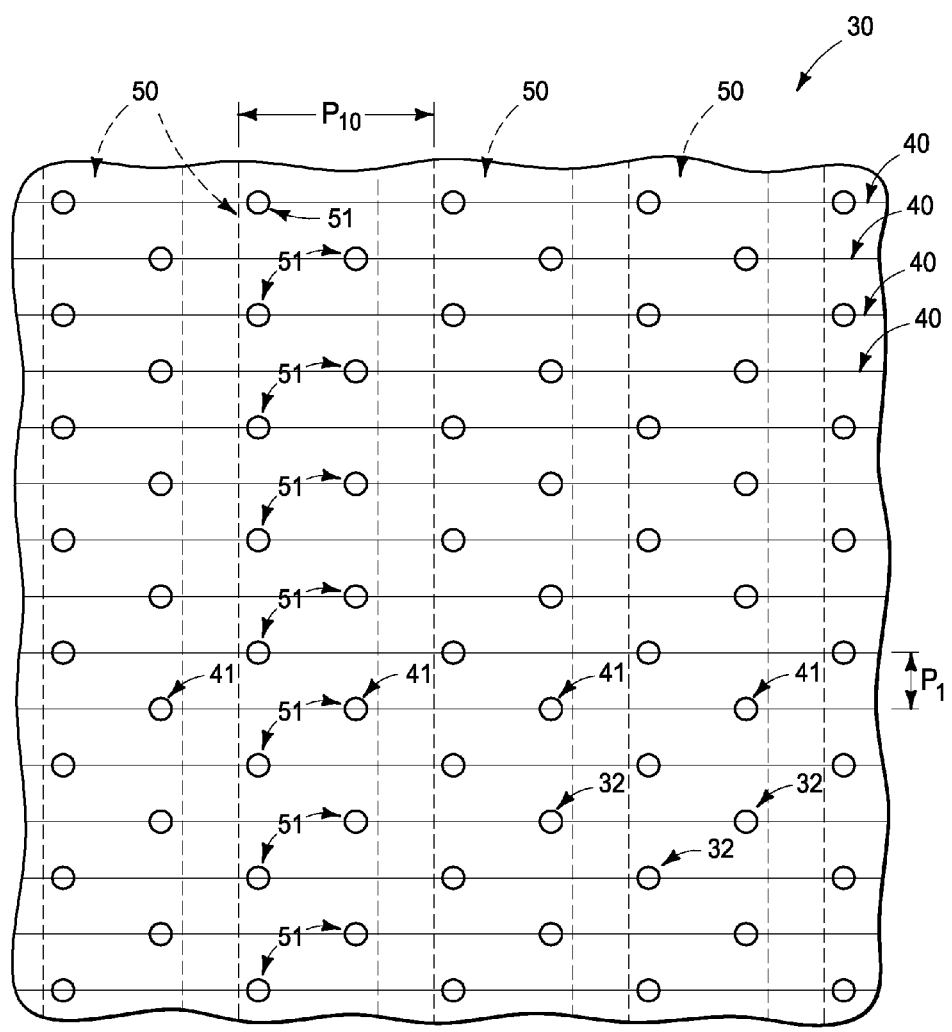
FIGS. 11-13 are diagrammatic top views of the example embodiment arrangements of FIG. 5 illustrating example embodiment bitline arrangements in combination with example embodiment drain-side select gate (SGD) arrangements.

FIG. 11 shows SGDs 50 (diagrammatically illustrated with dashed-line boundaries) utilized in combination with the bitlines 40 in the orientation described above with reference to FIG. 8.

The SGDs 50 are on a pitch $P_{10}$ which is larger than the pitch $P_1$ of the bitlines 40.

The SGDs 50 may be each considered to be proximate to (e.g., at least partially surround) a respective plurality of pillars, with the pillars proximate to the same SGD as one another being in a same tile as one another. For instance, a plurality of pillars is labeled as pillars 51, and is shown as being in the same tile as one another. The pillars 51 are identical to the other pillars 32, and are labeled differently only to illustrate an individual tile.

FIG. 12 shows another SGD arrangement, and illustrates SGDs 50a (diagrammatically illustrated with dashed-line boundaries) utilized in combination with the bitlines 40 in the orientation described above with reference to FIG. 9.

The SGDs 50a are on a pitch $P_{11}$ which is larger than the pitch $P_2$ of the bitlines 40.

The SGDs 50a may be each considered to be proximate to (e.g., at least partially surround) a plurality of pillars, with the pillars proximate to the same SGD as one another being in a same tile as one another. For instance, a plurality of pillars is labeled as pillars 51a, and is shown as being in the same tile as one another. The pillars 51a are identical to the other pillars 32, and are labeled differently only to illustrate an individual tile.

FIG. 13 shows another SGD arrangement, and illustrates SGDs 50b (diagrammatically illustrated with dashed-line boundaries) utilized in combination with the bitlines 40 in the orientation described above with reference to FIG. 10.

The SGDs 50b are on a pitch $P_{12}$ which is larger than the pitch $P_3$ of the bitlines 40. In the embodiment of FIG. 13, the pitch $P_{12}$ of the SGDs is greater than double the pitches P and $P_3$; and accordingly is greater than double the distance between immediately adjacent pillars and bitlines. In some embodiments, the SGD pitch may be at least four-fold greater than the bitline pitch.

The SGDs 50b may be each considered to be proximate to a plurality of pillars, with the pillars proximate to the same SGD as one another being in a same tile as one another. For instance, a plurality of pillars is labeled as pillars 51b, and is shown as being in the same tile as one another. The pillars 51b are identical to the other pillars 32, and are labeled differently only to illustrate an individual tile.

A pillar pattern 34 is shown encompassed by a single one of the SGDs 50b. Notably, all seven pillars of the pattern are included in the tile defined by the SGD. For example, all 7 pillars in the pillar pattern 34 are at least partially surrounded by the respective one of the SGDs 50b.

Although the bitlines are shown at an off angle in FIG. 13, a semiconductor die having the bitlines may be rotated so that the bitlines are actually fabricated at about 0° or about 90°.

Figure 14:
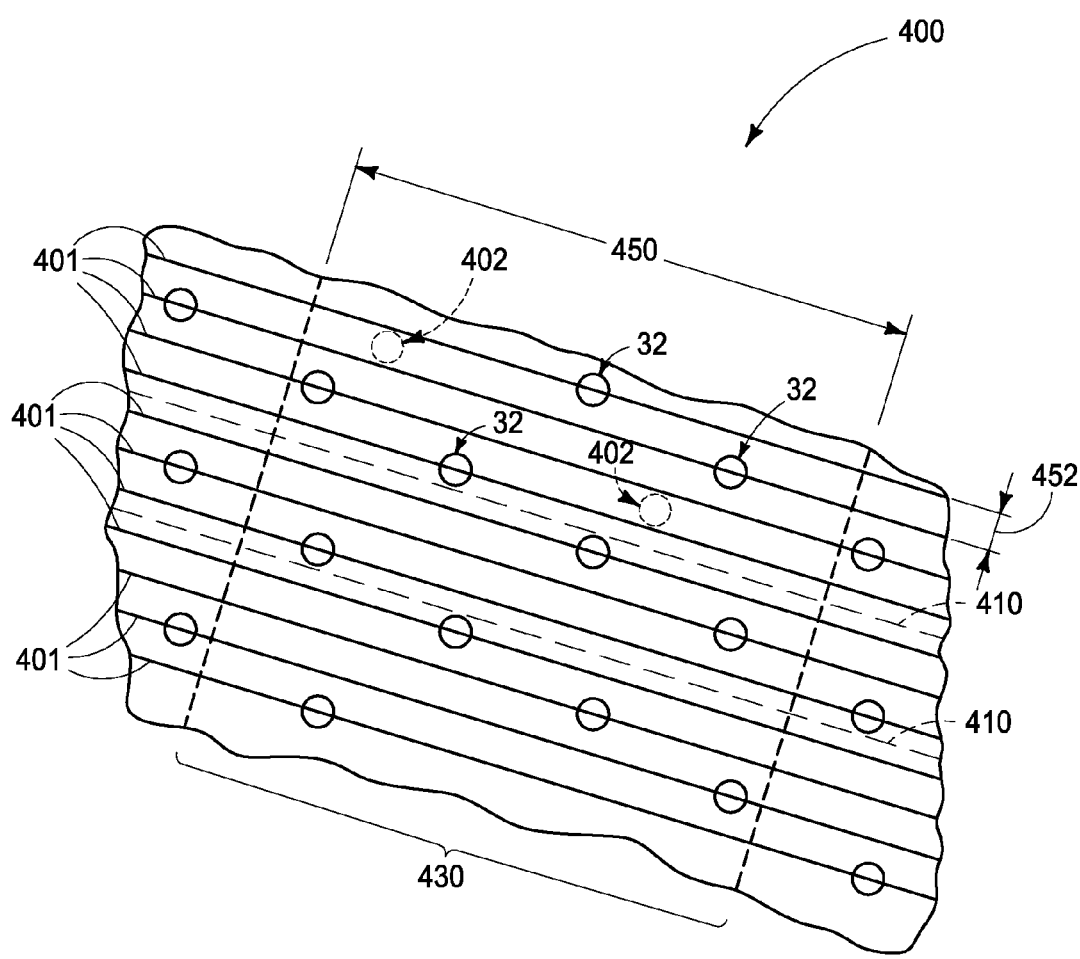
FIG. 14 is a diagrammatic top view of another example embodiment bitline arrangement in combination with an example embodiment drain-side select gate (SGD) arrangement.

FIG. 14 shows a construction 400 illustrating another arrangement of bitlines to SGDs. Specifically, the construction comprises a plurality of pillars 32 connected to a common tile 430 defined by an SGD, with each pillar being coupled to a bitline 401 passing through the tile. In the shown embodiment, there are some additional pillars 402 within a pattern covered by SGD 430 and not part of the hexagonal closest packed pattern; and there are some additional bitlines 410 passing across the tile but not connected to any pillars within the tile. The additional bitlines 410 are over pillars 32, and may be at a level above or below the level of bitlines 401. The additional pillars 402 may be configured to extend through the hexagonal closest packed arrangement of pillars 32 without substantially disrupting such hexagonal closest packed arrangement or may be configured to be proximate the hexagonal closest packed arrangement of pillars 32 without extending through the arrangement; and may, for example, be thin as compared to pillars 32 and/or be at a different elevational level than pillars 32. The additional pillars 32 are encompassed by the SGD and may be connected to the SGD 430 in some embodiments, and may not be connected to the SGD 430 in other embodiments.

The arrangement of FIG. 14 comprises bitlines spaced by a distance 452 and SGDs having dimension 450 (which may be considered to be about the pitch of the SDGs in some embodiments since spacing between adjacent SGDs may be negligible). In some example embodiments, distance 452 may be less than or equal to about 60 nm (such as, for example, 52 nm, 38 nm, etc.), and distance 452 may be greater than or equal to about 400 nm (such as, for example, 423 nm, 577 nm, etc.). For instance, in some embodiments, distances 452 and 450 may be about 52 nm and about 423 nm, respectively; about 38 nm and 577 nm, respectively, etc.

Each pillar is uniquely addressed by a tile and column in the configurations of FIGS. 11-14. Specifically, every pillar within a tile defined by an SGD can be coupled to a different bitline than every other pillar within the same tile. Notably, the embodiment of FIG. 13 has all seven different pillars of an individual pattern 34 within an individual tile defined by an SGD, and uniquely addressed by separate bitlines utilized in combination with such SGD. The embodiments of FIGS. 10, 13 and 14 may be considered advantageous for particular applications, while embodiments of FIGS. 7-9, 11 and 12 are analogous to prior approaches and have been considered by applicant and found less satisfactory for particular applications.

In some embodiments, the invention includes recognition that the pitch of bitlines across an HCP arrangement of pillars is related to the pitch of SGDs through geometrical constraints. FIG. 15 comprises a graph 68 which illustrates such relationship between SGD pitch and bitline pitch. Specifically, a curve 70 is provided which shows that there is an inverse relationship between changes in bitline pitch relative to changes in SGD pitch. Specifically, if bitline pitch changes by an amount "x", then SGD pitch changes by an amount "1/x".

Pages are utilized for reading and writing, and may define the smallest unit in the NAND architecture which may be addressed during a read/write operation (although some architectures may enable partial page read operations). Another characteristic of NAND architecture is an erase block, and such defines the smallest unit which may be erased in a block-erase operation. It is often desired to tailor the relative sizes of the pages and blocks. Practical constraints relative to routing and wiring may require multiple pages to be utilized in each block. However, larger pages may enable a single block to contain fewer pages, while smaller pages may require more pages to be utilized per block. Accordingly, the embodiment of FIG. 13 with the relatively large SGDs may be utilized in applications in which it is desired to have fewer pages per block, while the embodiment of FIG. 12 may be utilized in applications in which it is desired to have a higher number of pages per block.

There are several applications in which it is desired to reduce the number of pages per block for performance, cost, etc. Such reduction may simplify operation by providing better correspondence between granularity of data written to the memory, and granularity of data erased from the memory. For instance, operations associated with NAND may involve "garbage-collection", which is sorting data from blocks prior to erasing the blocks so that only garbage is removed. Reduction of the number of pages per block may simplify such operations.

Another advantage of having larger SGDs, and accordingly fewer SGDs per block, is that the number of SGD drivers may be reduced. Such may reduce the area of the circuitry (which may be formed under the array) dedicated to fabrication of such drivers, freeing up regions of such area for other uses. Further, there may be die penalties associated with spacing between SGDs, and the reduction in a total number of SGDs achieved by utilizing larger SGDs may reduce the die penalties.

There are also applications in which it is desired to have a large number of pages per block, such as applications in which an erase operation is a limiting operation relative to circuit performance. In such applications, it may be desired to utilize relatively small pages in order to increase the number of pages per block.

The relationship of FIG. 15 may be utilized for modifying data line and pillar arrangements to achieve desired characteristics. For instance, an initial architecture may have an initial pitch of bitlines, an initial pitch of SGDs, and a first correspondence of the number of pages per erase block. The pitches of the bitlines and SGDs may be altered to form a second architecture having a second correspondence of pages to erase blocks. Such alteration of the pitches of the bitlines and the SGDs may utilize the relationship of FIG. 15 where the change in pitch of the bitlines is "x" and the change in pitch of the SGDs is "1/x". Accordingly, once a suitable architecture is developed, the relationship of FIG. 15 may be utilized to modify the architecture for applications in which it is desired to either increase the number of pages per erase block (i.e., to reduce the size of pages through a decrease in the size of SGDs), or to decrease the number of pages per erase block (i.e., to increase the size of pages through an increase in the size of SGDs).

The apparatuses discussed above may be incorporated into, or may comprise, electronic devices and systems, such as, for example, clocks, televisions, cell phones, personal computers, automobiles, industrial control systems, aircraft, etc.

The particular orientation of the various embodiments in the drawings is for illustrative purposes only, and the embodiments may be rotated relative to the shown orientations in some applications. The description provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections in order to simplify the drawings. Also, the drawings do not show extra spacing that may be provided between pillars to achieve adequate SGD-to-SGD spacing in some embodiments.

Some embodiments include an apparatus comprising a plurality of semiconductor pillars in a substantially hexagonally closest packed arrangement. The hexagonally closest packed arrangement comprises a repeating pillar pattern, with the repeating pillar pattern having at least portions of 7 different pillars. Each of the different pillars in a respective one of the repeating pillar patterns is capable of being electrically coupled to a different data line of a plurality of data lines.

Some embodiments include an apparatus comprising a plurality of semiconductor pillars in a substantially hexagonally closest packed arrangement. The hexagonally closest packed arrangement comprises a repeating pillar pattern, with the repeating pillar pattern having at least portions of 7 different pillars. All 7 different pillars of a repeating pillar pattern are encompassed by a single drain-side select gate (SGD).

Some embodiments include an apparatus comprising a plurality of semiconductor pillars in a substantially hexagonally closest packed arrangement. The hexagonally closest packed arrangement comprising a repeating pillar pattern, with the repeating pillar pattern having at least portions of 7 different pillars, wherein each of the different pillars in a respective one of the repeating pillar patterns is capable of being electrically coupled to a different data line of a plurality of data lines. The data lines are on a pitch of less than or equal to about 60 nanometers. Each of the pillars in a respective one of the repeating pillar patterns is encompassed by a single drain-side select gate (SGD) of a plurality of SGDS. The SGDs are on a pitch of greater than or equal to about 400 nanometers.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. An apparatus, comprising a plurality of semiconductor pillars in a substantially hexagonally closest packed arrangement; the hexagonally closest packed arrangement comprising a repeating pillar pattern, with the repeating pillar pattern having at least portions of 7 different pillars, wherein each of the different pillars in a respective one of the repeating pillar patterns is electrically coupled to a different data line of a plurality of data lines; and wherein each of the pillars in a respective one of the repeating pillar patterns is encompassed by a single drain-side select gate (SGD); the pillars and SGD being supported by a base comprising monocrystalline silicon.

2. The apparatus of claim 1, wherein said each of the pillars in a respective one of the repeating pillar patterns being encompassed by a single drain-side select gate (SGD) comprises each of the pillars in the respective one of the repeating pillar patterns being at least partially surrounded by the single SGD, and wherein activation of the single SGD electrically couples the 7 different pillars to 7 different data lines.

3. The apparatus of claim 2, wherein a drain-side select gate (SGD) pitch as at least four-fold larger than a pitch of the data lines.

4. The apparatus of claim 3, wherein the drain-side select gate (SGD) comprises a common gate conductor for a plurality of SGD devices.

5. The apparatus of claim 1, wherein the data lines comprise bitlines.

6. The apparatus of claim 1, wherein the pillars are substantially vertical.

7. The apparatus of claim 1, wherein additional data lines are above the repeating pillar pattern and are not connected to any of the 7 pillars of the repeating pillar pattern.

8. An apparatus, comprising a plurality of semiconductor pillars in a substantially hexagonally closest packed arrangement; the hexagonally closest packed arrangement comprising a repeating pillar pattern, with the repeating pillar pattern having at least portions of 7 different pillars, wherein all 7 different pillars of a repeating pillar pattern are encompassed by a single drain-side select gate (SGD); wherein the pillars are substantially vertical and comprise polysilicon; wherein the pillars and SGD are supported by a base comprising monocrystalline silicon.

9. The apparatus of claim 8, wherein the polysilicon of the pillars surrounds a dielectric material.

10. The apparatus of claim 9, wherein the dielectric material comprises silicon dioxide.

11. The apparatus of claim 8, wherein the pillars are on a first pitch, and wherein the drain-side select gate (SGD) is one of a plurality of SGDs on a second pitch which is at least double the first pitch.

12. The apparatus of claim 8, wherein additional pillars are encompassed by the SGD and are not part of the repeating hexagonal pattern.

13. An apparatus, comprising a plurality of semiconductor pillars in a substantially hexagonally closest packed arrangement; the hexagonally closest packed arrangement comprising a repeating pillar pattern, with the repeating pillar pattern having at least portions of 7 different pillars, wherein each of the different pillars in a respective one of the repeating pillar patterns is electrically coupled to a different data line of a plurality of data lines; wherein the data lines are on a pitch of less than or equal to about 60 nanometers; wherein each of the pillars in a respective one of the repeating pillar patterns is encompassed by a single drain-side select gate (SGD) of a plurality of SGDs, and wherein the SGDs are on a pitch of greater than or equal to about 400 nanometers; wherein the pillars and SGD are supported by a base comprising monocrystalline silicon; and wherein the pillars comprise polysilicon surrounding dielectric material.

14. The apparatus of claim 13, wherein the data lines are on a pitch of less than or equal to about 52 nanometers and wherein the SGDs are on a pitch of greater than or equal to about 423 nanometers.

15. The apparatus of claim 13, wherein the data lines are on a pitch of less than or equal to about 38 nanometers and wherein the SGDs are on a pitch of greater than or equal to about 577 nanometers.

16. The apparatus of claim 13, wherein additional data lines are above the repeating pillar pattern and are not connected to any of the 7 pillars of the repeating pillar pattern.

17. The apparatus of claim 13, wherein additional pillars are encompassed by the SGD and are not part of the repeating hexagonal pattern.

18. The apparatus of claim 13, wherein the pillars are substantially vertical and are comprised by vertically-stacked memory cells.

* * * * *